United States Patent
Nakatsuka

(10) Patent No.: US 10,515,286 B2
(45) Date of Patent: Dec. 24, 2019

(54) IMAGE PROCESSING APPARATUS THAT PERFORMS COMPRESSION PROCESSING OF DOCUMENT FILE AND COMPRESSION METHOD OF DOCUMENT FILE AND STORAGE MEDIUM

(71) Applicant: CANON KABUSHIKI KAISHA, Tokyo (JP)

(72) Inventor: Tadanori Nakatsuka, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/601,167

(22) Filed: May 22, 2017

(65) Prior Publication Data

US 2017/0344583 A1    Nov. 30, 2017

(30) Foreign Application Priority Data

May 27, 2016  (JP) .................................. 2016-106494

(51) Int. Cl.
*G06F 17/22*   (2006.01)
*G06K 9/46*    (2006.01)

(52) U.S. Cl.
CPC ...................... *G06K 9/46* (2013.01)

(58) Field of Classification Search
CPC ..... G06K 9/46; G06F 17/2205; G06F 17/241; G06F 17/30569; H03M 7/30; H04N 19/172
USPC ........................................................ 715/230
See application file for complete search history.

(56) References Cited

U.S. PATENT DOCUMENTS

| | | | | |
|---|---|---|---|---|
| 4,647,962 A * | 3/1987 | Rosen | .................. | H04N 1/4055 347/232 |
| 4,899,394 A * | 2/1990 | Lee | .......................... | G06T 9/00 382/176 |
| 5,046,121 A * | 9/1991 | Yonekawa | ............. | H04N 19/60 358/1.9 |
| 5,239,625 A * | 8/1993 | Bogart | .................. | G06K 15/00 345/428 |

(Continued)

FOREIGN PATENT DOCUMENTS

| | | |
|---|---|---|
| JP | 2000306103 A | 11/2000 |
| JP | 2000332984 A | 11/2000 |

(Continued)

OTHER PUBLICATIONS

PDF Reference Adobe Portable Document Format Version 1.4; 2001; Addison-Wesley; Third edition; p. 12.*

(Continued)

*Primary Examiner* — Andrew R Dyer
(74) *Attorney, Agent, or Firm* — Rossi, Kimms & McDowell LLP

(57) ABSTRACT

Even in the case of a document file including an annotation and text within a page, the file size is reduced while retaining annotation and text information. An image processing apparatus that extracts an annotation object and a text object from a page of an input document file, converts other objects included within the page except for the extracted annotation object and text object into one image object, compresses the converted one image object, and generates page data based on the compressed image object and the extracted annotation object and text object.

14 Claims, 10 Drawing Sheets

(56) References Cited

U.S. PATENT DOCUMENTS

| | | | | |
|---|---|---|---|---|
| 5,327,265 | A * | 7/1994 | McDonald | H04N 1/2179 358/444 |
| 5,402,148 | A * | 3/1995 | Post | A61B 5/044 345/213 |
| 5,426,594 | A * | 6/1995 | Wright | H04L 51/38 340/7.21 |
| 5,696,848 | A * | 12/1997 | Patti | G06T 3/4053 348/E5.062 |
| 5,980,044 | A * | 11/1999 | Cannon | G09B 9/32 353/121 |
| 6,535,652 | B2 * | 3/2003 | Nakatsuka | G06F 17/3025 358/403 |
| 8,397,155 | B1 * | 3/2013 | Szabo | G06F 17/211 715/209 |
| 8,648,858 | B1 * | 2/2014 | Swenson | G06T 9/00 345/428 |
| 2001/0014900 | A1 * | 8/2001 | Brauer | G06F 17/211 715/201 |
| 2002/0033971 | A1 * | 3/2002 | Takaki | H04N 1/333 358/448 |
| 2002/0057441 | A1 * | 5/2002 | Chen | G06T 11/60 358/1.2 |
| 2002/0067502 | A1 * | 6/2002 | Hansen | B42C 19/02 358/1.15 |
| 2004/0148274 | A1 * | 7/2004 | Warnock | G06K 9/00469 |
| 2006/0224697 | A1 * | 10/2006 | Norris | G06F 9/451 709/218 |
| 2007/0053602 | A1 * | 3/2007 | Kanatsu | H04N 1/642 382/244 |
| 2007/0100846 | A1 * | 5/2007 | King | G06F 17/30067 |
| 2008/0129760 | A1 * | 6/2008 | Phan | G09G 3/342 345/690 |
| 2008/0267494 | A1 * | 10/2008 | Cohen | G06T 3/4007 382/166 |
| 2009/0235161 | A1 * | 9/2009 | Williams | G06F 17/2247 715/255 |
| 2011/0033125 | A1 * | 2/2011 | Shiraishi | H04N 1/41 382/238 |
| 2011/0209044 | A1 * | 8/2011 | Kutsumi | G06T 11/60 715/232 |
| 2011/0235080 | A1 * | 9/2011 | Satou | G06K 15/1857 358/1.13 |
| 2014/0281940 | A1 * | 9/2014 | Cogan | G06F 17/24 715/256 |
| 2015/0304369 | A1 * | 10/2015 | Sandholm | G06Q 10/10 715/753 |

FOREIGN PATENT DOCUMENTS

| | | |
|---|---|---|
| JP | 2007334437 A | 12/2007 |
| KR | 10-2006-0046396 A | 5/2006 |

OTHER PUBLICATIONS

Office Action issued in Korean Application No. 10-2017-0065128, dated Sep. 4, 2019, Korean Intellectual Property Office, English Translation included. 12 Pages.*

* cited by examiner

IMAGE PROCESSING APPARATUS THAT PERFORMS COMPRESSION PROCESSING OF DOCUMENT FILE AND COMPRESSION METHOD OF DOCUMENT FILE AND STORAGE MEDIUM

BACKGROUND OF THE INVENTION

Field of the Invention

The present invention relates to a compression technique of document data.

Description of the Related Art

As a technique to save a document, conventionally, a variety of proposals have been made in accordance with purposes and uses thereof. For example, Japanese Patent Laid-Open No. 2000-332984 has proposed a technique to change the saving method by classifying documents into text-based documents and picture-based documents based on the ratio between the text area and the image area within the document for the purpose of suppressing the amount of data and maintaining image quality at the time of saving a document image.

Here, a case is considered where a document file in a format, for example, such as a PDF, is saved, which is capable of separately storing objects, such as text, path, and annotations, in addition to images as contents making up a page. The annotation is an object independent of a main sentence, which is attached for the purpose of supplementing, enhancing, and so on, the main sentence. In the case where an attempt is made so save a document file in such a format by applying the above-described technique of Japanese Patent Laid-Open No. 2000-332984, it is no longer possible to retain annotation information accompanying creation of image data of a page. In addition, it is also no longer possible to edit the text information portion within the page. Further, at the time of saving a document, in general, it is also required to suppress the amount of data to a bare minimum, but Japanese Patent Laid-Open No. 2000-332984 does not taken this point into consideration in particular.

SUMMARY OF THE INVENTION

The image processing apparatus according to the present invention includes: an extraction unit configured to extract an annotation object and a text object from a page of an input document file; a compression unit configured to convert other objects included within the page except for the extracted annotation object and text object into one image object and to compress the converted one image object; and a generation unit configured to generate page data based on the image object compressed by the compression unit and the annotation object and the text object extracted by the extraction unit.

Further features of the present invention will become apparent from the following description of exemplary embodiments with reference to the attached drawings.

DESCRIPTION OF THE EMBODIMENTS

Hereinafter, with reference to the attached drawings, the present invention is explained in detail in accordance with preferred embodiments. Configurations shown in the following embodiments are merely exemplary and the present invention is not limited to the configurations shown schematically.

First Embodiment

Figure 1:
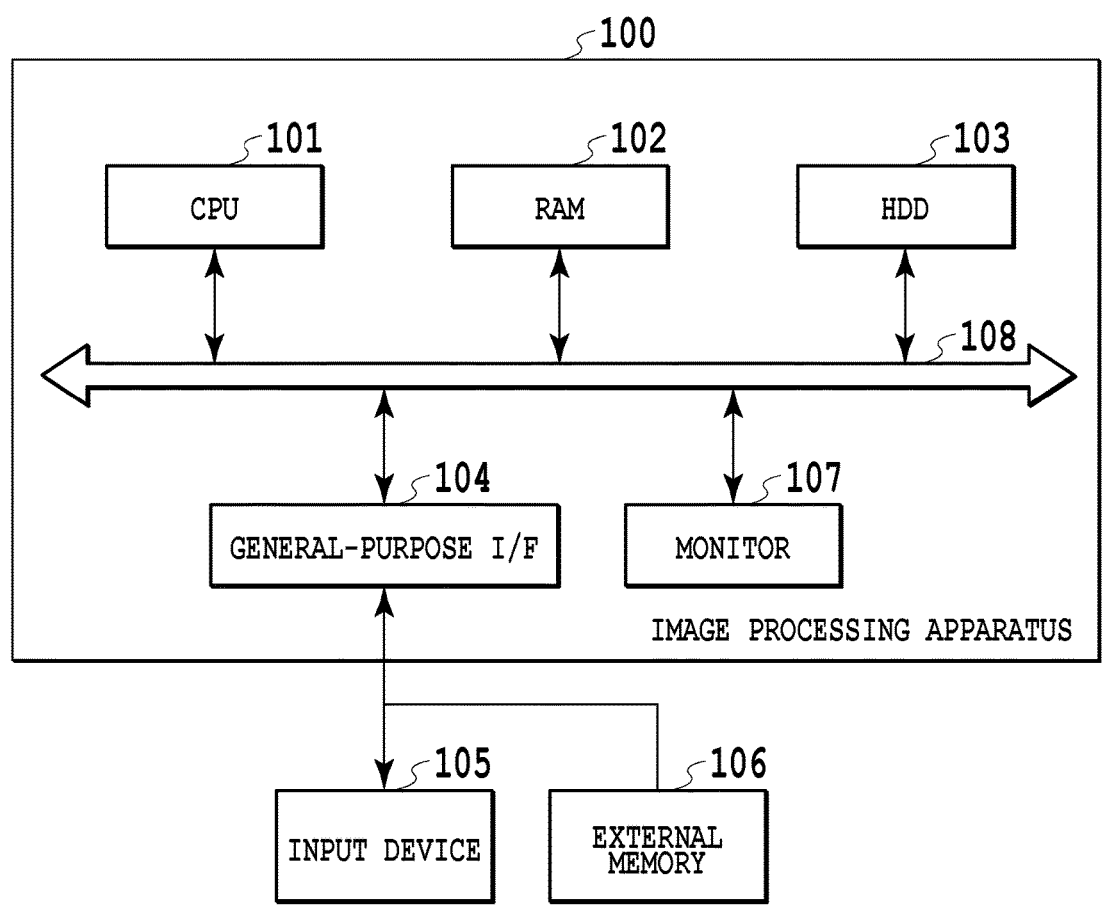
FIG. 1 is a diagram showing an example of a hardware configuration of an image processing apparatus.

FIG. 1 is a diagram showing an example of a hardware configuration of an image processing apparatus according to the present embodiment. An image processing apparatus 100 is, for example, a PC and the like and includes a CPU 101, a RAM 102, an HDD 103, a general-purpose interface (I/F) 104, a monitor 107, and a main bus 108. Then, by the general-purpose I/F 104, an input device 105, such as a mouse and a keyboard, and an external memory 106, such as a memory card, are connected to the main bus 108. The CPU 101 implements various kinds of processing, such as creation and editing of a sentence and a table, by causing predetermined applications (computer programs) stored in the HDD 103 to run. In the following, processing to save a document file by reducing the file size while retaining annotation and text information included in the document file by the CPU 101 executing a document editing application in the image processing apparatus 100 with the configuration shown in FIG. 1 is explained.

(Logic Configuration of Image Processing Apparatus)

Figure 2:
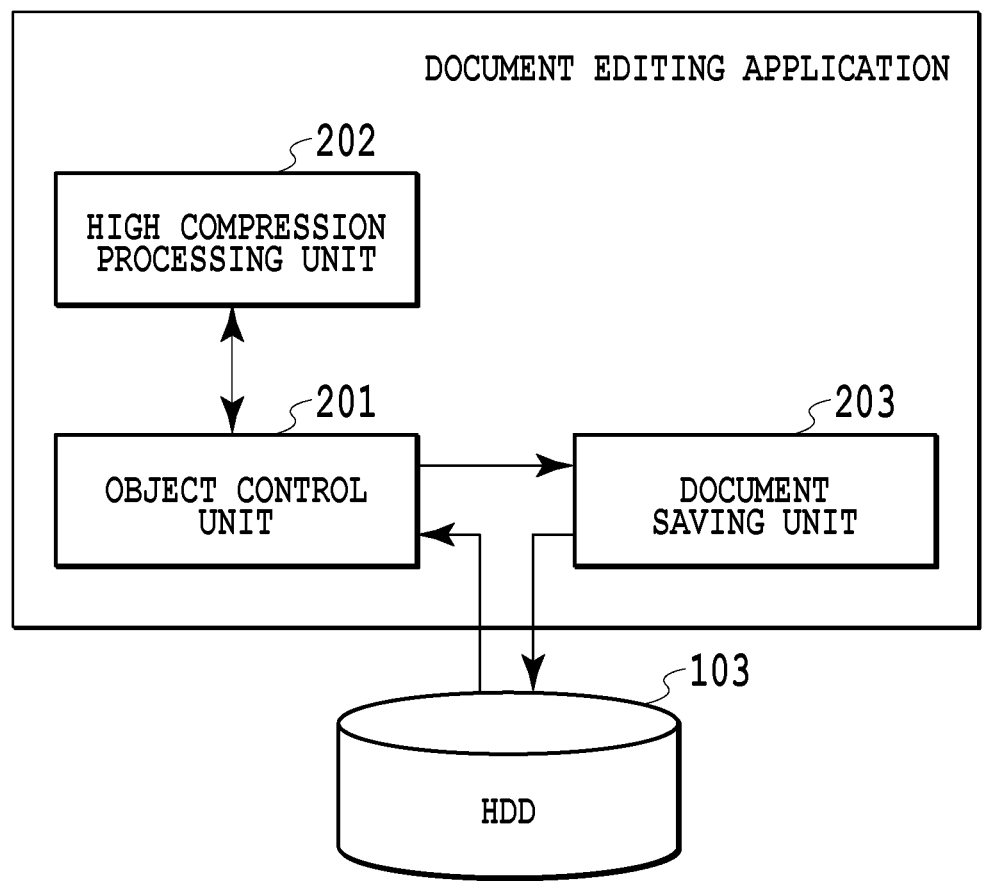
FIG. 2 is a block diagram showing an example of a logic configuration of a document editing application.

FIG. 2 is a block diagram showing an example of a logic configuration of a document editing application. A saving-target document file created by an arbitrary application is first input to an object control unit 201. Here, as the saving-target document file, a document file in a format capable of separately storing objects (hereinafter, described as "OBJ") of various attributes, such as image, text, path, and annotation, is supposed. As the format in this case, mentions is made of, for example, the previously described PDF (Portable Document Format).

(Portable Document Format).

First, the object control unit 201 performs processing (extraction processing) to temporarily extract annotation and text objects from each page of an input document file and to store the objects. Further, the object control unit 201 performs processing (returning processing) to return the stored annotation OBJ and text OBJ to page data for which compression processing, to be described later, has been performed. Furthermore, the object control unit 201 also performs processing (conversion processing) to convert the entire page from which the annotation and text objects have been extracted into one image object. By the processing such as this, the object control unit 201 generates data for saving obtained by reducing the file size for each page while keeping the same appearance as that of the initial state for each page of the input document file. The generated data for saving is delivered to a document saving unit 203. In the present embodiment, the configuration is such that the object control unit 201 is in charge of all of the extraction processing, the restoring processing, and the conversion processing, but it may also be possible to provide a module separately for each piece of processing.

A high compression processing unit 202 divides the area of the image OBJ (including the entire page image OBJ obtained by creating image data of the entire page from which the annotation and text OBJs have been removed) located within the page and performs compression processing appropriate to each area.

The document saving unit 203 puts together the data for saving for each page received from the object control unit 201 into one file and saves the file in the HDD 103 as an output document file.

(Flow of Saving of Document File)

Figure 3:
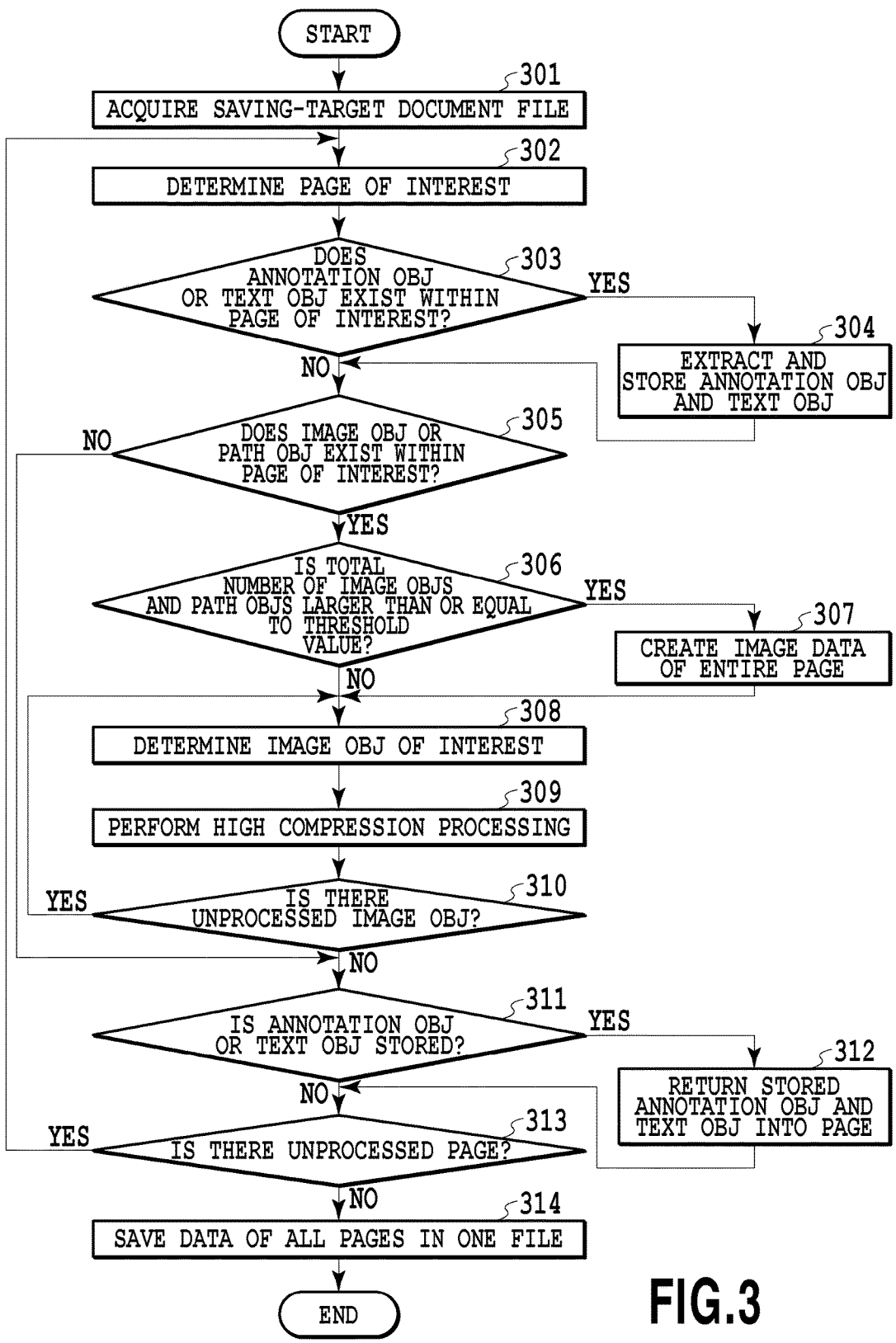
FIG. 3 is a flowchart showing a flow of document file saving processing according to a first embodiment.

Following the above, a flow of the series of document file saving in the document editing application is explained. FIG. 3 is a flowchart showing a flow of document file saving processing according to the present embodiment. The series of processing implemented by each processing unit shown in FIG. 2 is implemented by the CPU 101 loading a predetermined program stored in the HDD 103 onto the RAM 102 and executing the program.

At step 301, the object control unit 201 acquires an input document file. For example, the object control unit 201 reads a document file saved in the hard disk 103 and develops the document file onto the RAM 102.

Figure 4:
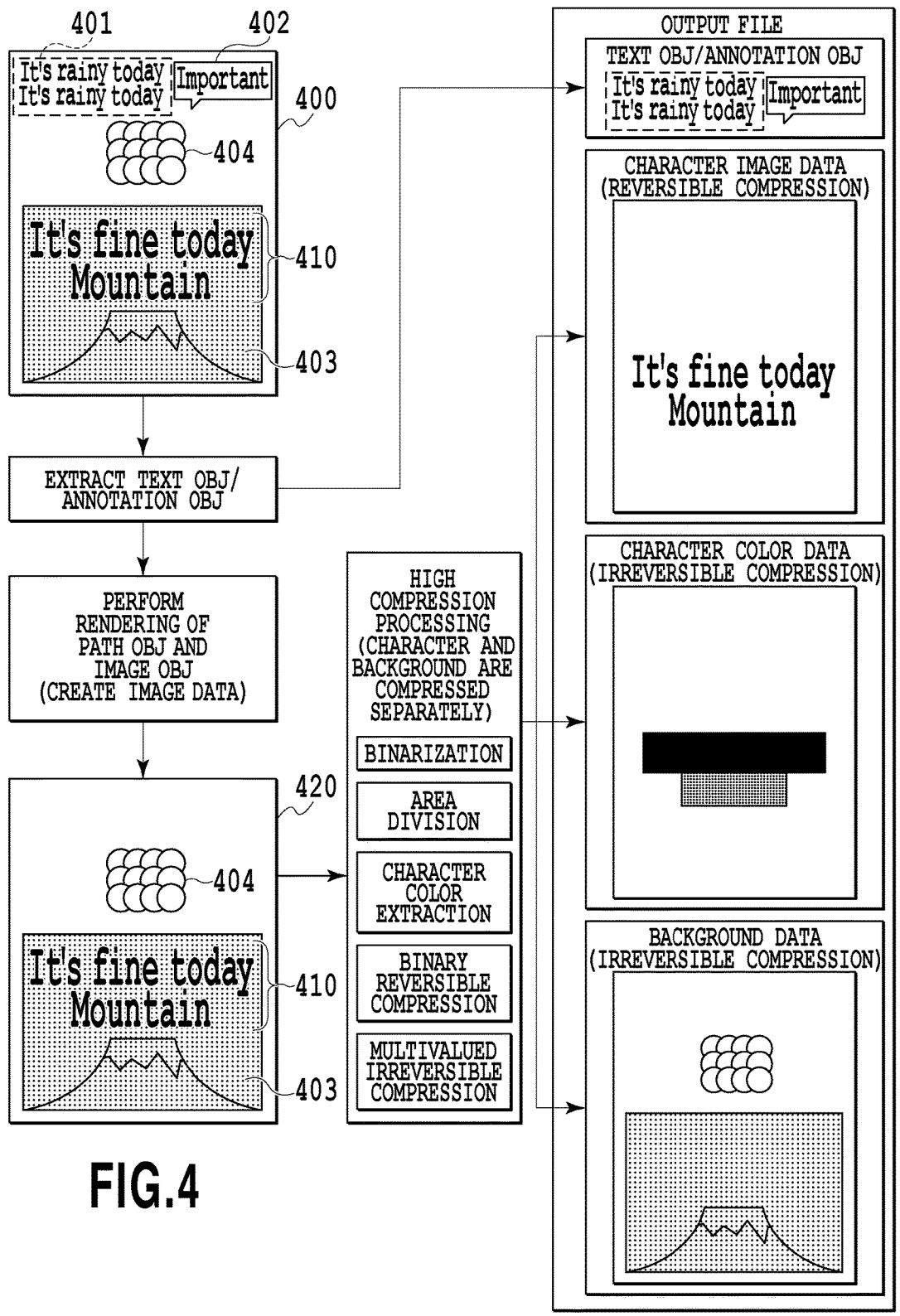
FIG. 4 is a diagram showing a process of document file saving.

At step 302, the object control unit 201 determines a page (hereinafter, "page of interest") on which attention is focused as a processing target of the pages of the document file developed onto the RAM 102. FIG. 4 is a diagram showing a process until the document file is saved along with a specific example. In FIG. 4, a page 400 as a page of interest includes a text OBJ 401, an annotation OBJ 402, an image OBJ 403, and a path OBJ group 404. The text OBJ 401 is an object of the text attribute, in which two character strings (color: black) of "It's rainy today" are arranged vertically. The image OBJ 403 is an object of the image attribute, in which a mountain is a subject, and which includes text information (within-image text) 410 in which "It's fine today" in black characters and "Mountain" in read characters are arranged vertically. Here, the text OBJ 401 is character data (code information) drawn by character code, font information, character pitch information, and so on. On the other hand, the within-image text 410 is simple image data (image information not including character code). As described above, the text OBJ 401 and the within-image text 410 are data quite different in nature from each other. The path OBJ group 404, which is a set of objects of the path attribute, represents a graphics in which a plurality of circles overlaps. Each path OBJ included in the path OBJ group 404 includes straight lines connecting a plurality of points and it is possible to represent a complicated shape by increasing the number of points. Then, it is possible to specify the color and thickness of the straight line, and in the case where an area surrounded by the straight lines exists, to specify the color within the area and to specify whether light is transmitted. In the case where a complicated object including a number of colors is drawn, a large number of small path OBJs are used. It is assumed that the path OBJ group 404 shown in FIG. 4 includes 10,000 path OBJs. The annotation 402 that represents the characters "Important" by a balloon is an object of the annotation attribute that supplements and so on the main sentence, different from the above-described OBJs (text OBJ 401, image OBJ 403, path OBJ group 404) making up the main sentence. The contents of the annotation OBJ 402 are represented by text, an image, path drawing and so on like each OBJ. To each OBJ making up the main sentence, attribute information indicating its attribute is attached and to the annotation OBJ, attribute information indicating that the OBJ is an annotation is also attached, in addition thereto. Further, it is possible to control the presence/absence of the display, the rotation direction, the position, and so on of the annotation OBJ separately from and independently of each OBJ making up the main sentence. Explanation is returned to the flow in FIG. 3.

At step 303, the object control unit 201 determines whether there is an annotation OBJ or a text OBJ within the page of interest based on the attribute information attached to each OBJ. In the case where an annotation OBJ or a text OBJ exists within the page of interest, the processing advances to step 304. On the other hand, in the case where neither annotation OBJ nor text OBJ exists within the page of interest, the processing advances to step 305. In the example in FIG. 4, both the annotation OBJ 402 and the text OBJ 401 exist within the page 400, and therefore, the processing advances to step 304 as a result.

At step 304, the object control unit 201 extracts the annotation OBJ and the text OBJ from the page of interest and stores the OBJs (in the RAM 102). In the case of the annotation OBJ, information making up the external appearance (contents of drawing) of the annotation and information indicating that the OBJ is an annotation are stored as a result. Specifically, in addition to the position coordinates indicating the display position within the page, the color, and the inclination, in the case of the character annotation, the font name, the font size, and the character code string are stored, in the case of the graphics annotation, the start point, the end point, the line thickness, the form, such as a solid line and a broken line, are stored, and in the case of the image annotation, its image data, the enlargement/contraction ratio and the like are stored. Further, in the case of the text OBJ, information, such as the position coordinates where the characters are displayed, the font name, the font size, the character code string, the color, and the inclination, is stored as a result. In the example in FIG. 4, the data of the annotation OBJ 402 and the text OBJ 401 is extracted from the page 400 and stored as a result. Due to this, in the page 400, only the image OBJ 403 and the path OBJ group 404 are left.

At step 305, the object control unit 201 determines whether an image OBJ or a path OBJ exists within the page of interest based on the attribute information attached to each OBJ. In the case where an image OBJ or a path OBJ exists within the page of interest, the processing advances to step 306. On the other hand, in the case where neither image OBJ nor path OBJ exists within the page of interest, the processing advances to step 313. In the example in FIG. 4, the image OBJ 403 and the path OBJ group 403 exist within the page 400, and therefore, the processing advances to step 306 as a result.

At step 306, the object control unit 201 determines whether the number of image OBJs or the number of path OBJs existing within the page of interest is larger than or equal to a predetermined threshold value. It is sufficient to determine the predetermined threshold value by taking into consideration the processing performance and the like of the CPU 101. At this time, it may also be possible to obtain the total number of image OBJs and path OBJs and to compare the obtained total number with one threshold value, or to set separate threshold values for the image OBJ and the path OBJ, respectively, and to determine whether one of the number of image OBJs and the number of path OBJs is larger than or equal to the corresponding threshold value. The size of the path OBJ is small compared to that of the image OBJ, and therefore, the degree in which the file size is affected is small. However, in the case where a large number of path OBJs exist, the drawing processing will take much time, and therefore, it is desirable to change the path OBJs into one OBJ by creating image data of the path OBJs. It is sufficient to set the predetermined threshold value by taking into consideration such a point. In the case where the results of the determination indicate that the number of image OBJs or the number of path OBJs is larger than or equal to the threshold value, the processing advances to step 307. On the other hand, in the case where both the number of image OBJs and the number of path OBJs are less than the threshold value, the processing advances to step 308. In the case where it is assumed that the threshold value is 1,000, in the example in FIG. 4, the number of image OBJs within the page 400 is one, but the number of path OBJs is 10,000, and therefore, the processing advances to step 307 as a result.

At step 307, the object control unit 201 creates image data of the entire page of interest. The page of interest in this case is a page from which the annotation OBJ and the text OBJ have been extracted (page including only the image OBJ and the path OBJ). By the creation of image data of the entire page, the entire page turns into one image OBJ. Symbol 420 in FIG. 4 indicates the image OBJ of the entire page obtained by creating image data of the entire page 400 from which the annotation OBJ and the text OBJ have been extracted. This image OBJ 420 includes the contents of drawing of the image OBJ 403 and the path OBJ group 404. By converting the entire page including a fixed number of image OBJs and path OBJs or more into one image OBJ as described above, it is made possible to shorten the time required for the subsequent drawing processing and printing processing. After creating image data of the entire page, the processing advances to step 308.

At step 308, the object control unit 201 determines an image OBJ of interest from the image OBJs of the page of interest. In this case, the image OBJ of the page of interest includes the image OBJ of the entire page obtained by creating image data of the entire page at step 307, besides the image OBJ originally existing within the page of interest. The data of the determined image OBJ of interest is delivered to the high compression processing unit 202.

At step 309, the high compression processing unit 202 divides the image OBJ of interest into a text area and a background area other than the text area and compresses each area by a scheme suitable for each area. In the case where there is no character information within the image OBJ of interest, this step is skipped and the processing advances to the next step 310. In the following, the high compression processing at this step is explained.

Figure 5:
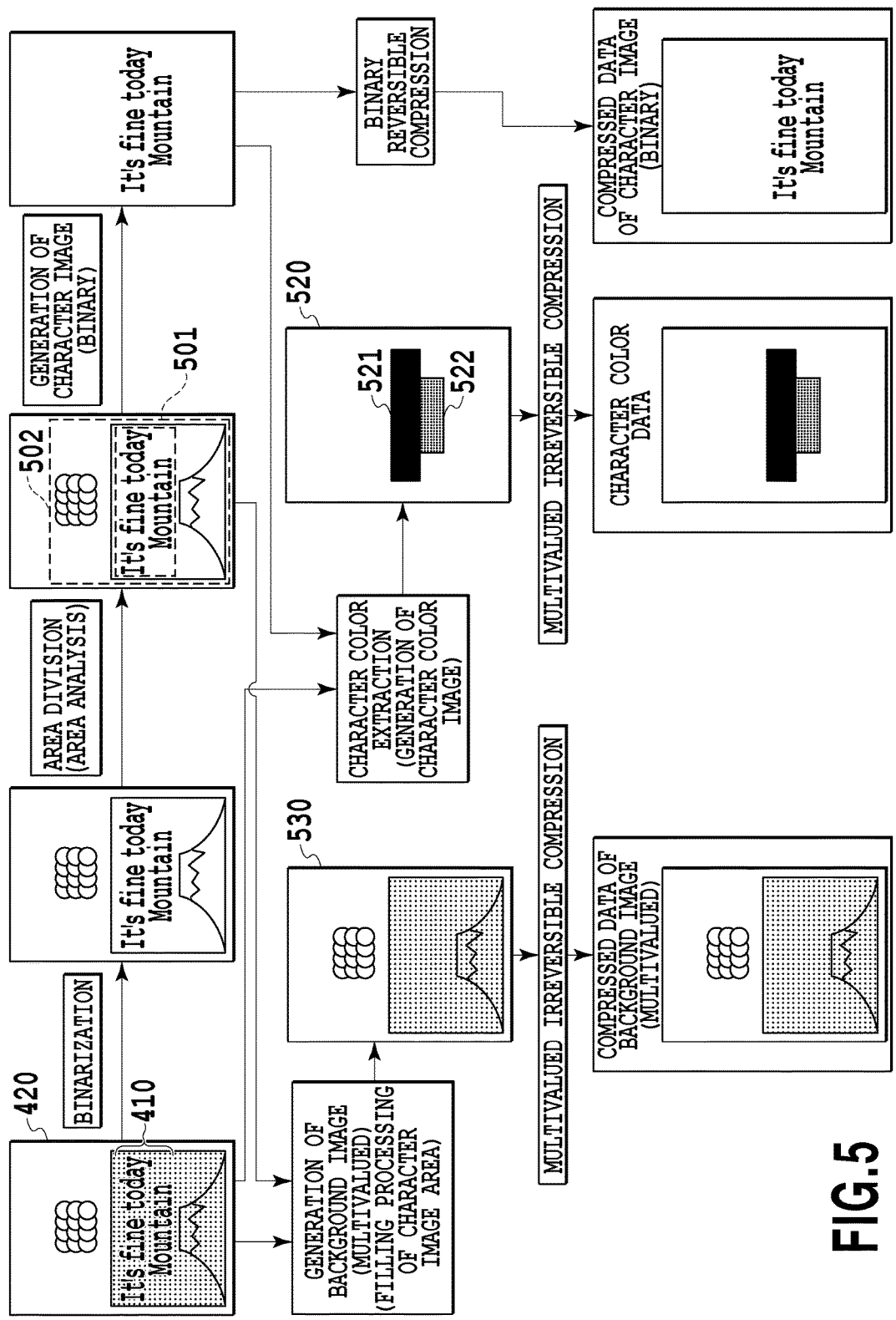
FIG. 5 is a diagram showing an example of high compression processing.

First, the image OBJ of interest is binarized and area division processing is performed for the obtained monochrome binary image. The area division in this case may be, for example, the common layout analysis technique as described in Japanese Patent-Laid Open No. 2000-332984. FIG. 5 is a diagram showing contents of the high compression processing in the case of the specific example (FIG. 4) described previously. In the case of the image OBJ 420, for which the image data of the entire page has been created, area division is performed so that the portion of the within-image text 410 becomes a text area 501 and the other portion becomes a background area 502. Then, for the text area 501, a binary image (character image 510) indicating "It's fine today" and "Mountain" is generated. Further, for the text area 501, the character color is extracted from the image OBJ 420 and the character image 510 and a character color image 520 corresponding to the text area 501 is generated. This character color image 520 is a multivalued image of the image attribute including a black rectangle 521 indicating the character color of "It's fine today" and a red rectangle 522 indicating the character color of "Mountain". Then, for the background area 502, a multivalued background image 530 obtained by performing filling processing for the character area portion in the character image 510 is generated. Then, for the binary character image 510, reversible compression processing (e.g., MMR compression) is performed and for the multivalued character color image 520 and the multivalued background image 530, irreversible compression processing (e.g., JPEG compression) is performed, respectively. The reason the reversible compression is applied to the glyph information in the text area is to suppress image quality from deteriorating at the time of decompression to maintain legibility. As described above, the image OBJ including character information is converted into three kinds of compressed image, i.e., a character image (binary), a character color image (multivalued), and a background image (multivalued).

At step 310, the object control unit 201 determines whether there is an unprocessed image OBJ within the page of interest. In the case where the results of the determination indicate that there is an unprocessed image OBJ within the page of interest, the processing returns to step 308 and the next image OBJ is determined and the processing is continued. On the other hand, in the case where all the image OBJs within the page of interest have already been processed, the processing advances to step 311. In the case where the image data of the entire page has been created at step 307, there is no unprocessed image OBJ left within the page, and therefore, the processing immediately advances to step 311.

At step 311, the object control unit 201 checks whether there is an annotation OBJ or a text OBJ extracted from the page of interest and stored. In the case where data of an annotation OBJ or a text OBJ is stored in the RAM 102, the processing advances to step 312. On the other hand, in the case where data of an annotation OBJ or a text OBJ is not stored in the RAM 102, the processing advances to step 313.

At step 312, the object control unit 201 returns the stored annotation OBJ and text OBJ into the page of interest in such a manner that its external appearance is maintained, and generates new page data as an output file. That is, the annotation OBJ and the text OBJ are returned into the page of interest in such a manner that its appearance is quite the same as the original one as to its position, size, rotation angle, and so on. As described above, in the present embodiment, an image OBJ is divided into the three kinds of image in total, i.e., two images (character image and character color image) making up the text area and a background image making up the area other than the text area. In the new page data, the page is described so that the background image is drawn at the same position within the page and with the same size under the character image and the character color image. In the case where the annotation OBJ overlaps the image OBJ, the page is described so that the annotation OBJ is further drawn over the three images.

At step 313, the object control unit 201 determines whether all the pages of the document file developed onto the RAM 102 have been processed. In the case where there is an unprocessed page, the processing returns to step 302 and the next page of interest is determined and the processing is continued. On the other hand, in the case where all the pages have been processed, the processing advances to step 314.

At step 314, the document saving unit 203 generates one document file for saving by putting together each piece of page data and saves the document file in the HDD 103.

The above is the contents of the document file saving processing according to the present embodiment.

Figure 6:
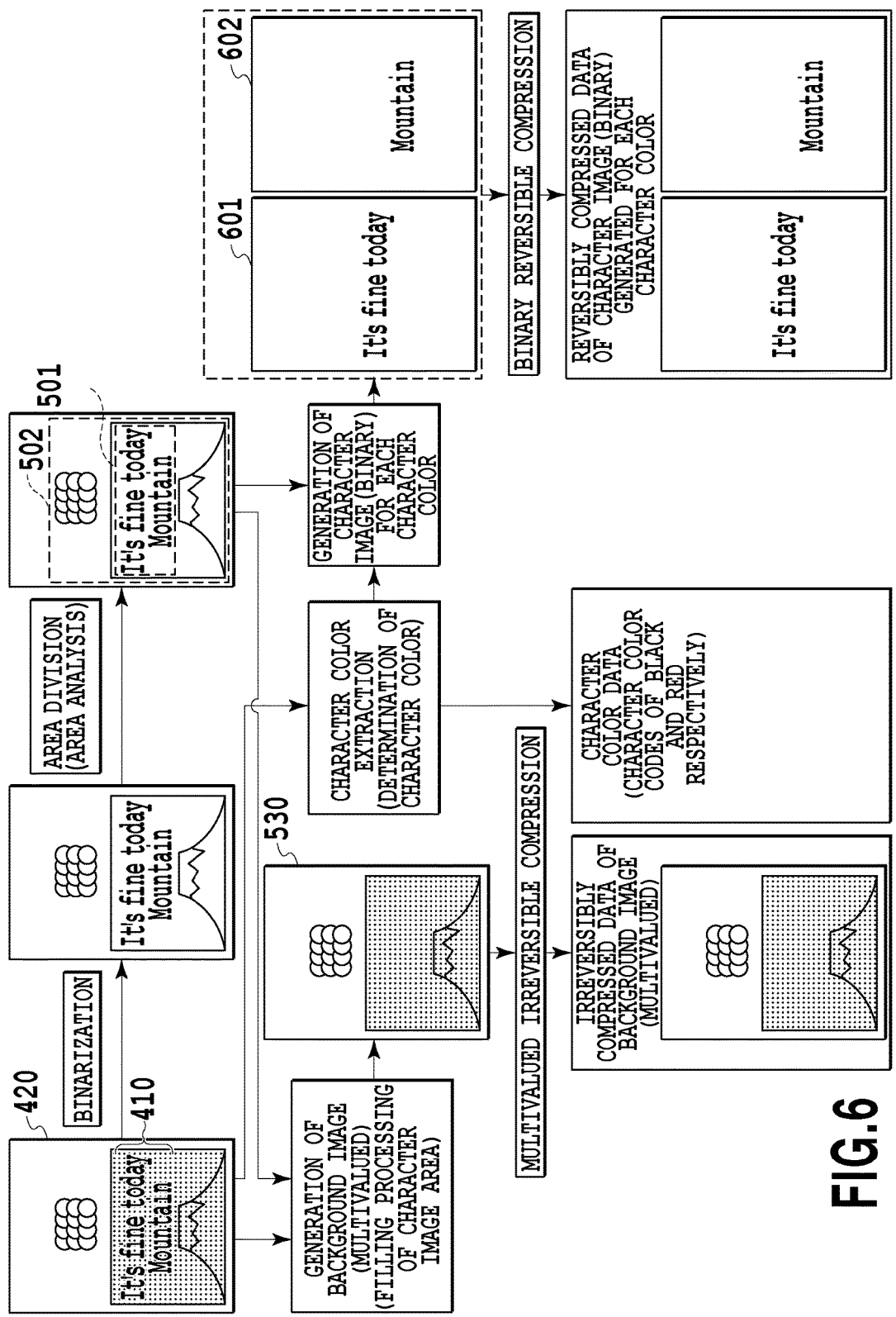
FIG. 6 is a diagram showing an example of high compression processing.

In the above-described high compression processing, the text area obtained by the area division is converted into the two kinds of compressed image, i.e., the character image (binary) and the character color image (multivalued), but it may also be possible to represent character color information by a character code in place of an image. FIG. 6 is a diagram showing an example of the high compression processing in the case where the character color information in the text area is represented by a character code. In this example, in addition to performing the area division for the image OBJ 420, color determination of the character portion is performed. Then, based on the results of the color determination of the character portion, a binary character image is generated for each character color. In the example in FIG. 6, two character images are generated: a character image 601 corresponding to the black characters "It's fine today" and a character image 602 corresponding to the red characters "Mountain". Then, for these two character images (binary), the reversible compression processing is performed. Then, character color codes (black and red character color codes) in accordance with the results of the color determination are associated with the compressed images of the two character images 601 and 602, respectively. As described above, it may also be possible to convert the text area obtained by the area division into the character image (binary) and the character color code for each character color and to perform compression processing for the character image generated for each character color.

Further, it may also be possible to reduce the data size of an image OBJ by reducing the resolution of the image or changing the compression scheme to one with a higher compression rate, in place of performing compression by separating an image OBJ into the text area and the background area by the area division.

According to the present embodiment, in the case where an annotation or text is included within a page of a saving-target document file, it is possible to reduce the file size while retaining the information. Further, in the case where the image data of the entire page has been created under predetermined conditions, the number of OBJs is reduced, and therefore, it is made possible to reduce the time required for the page drawing processing in the saved document file.

Second Embodiment

Figure 7:
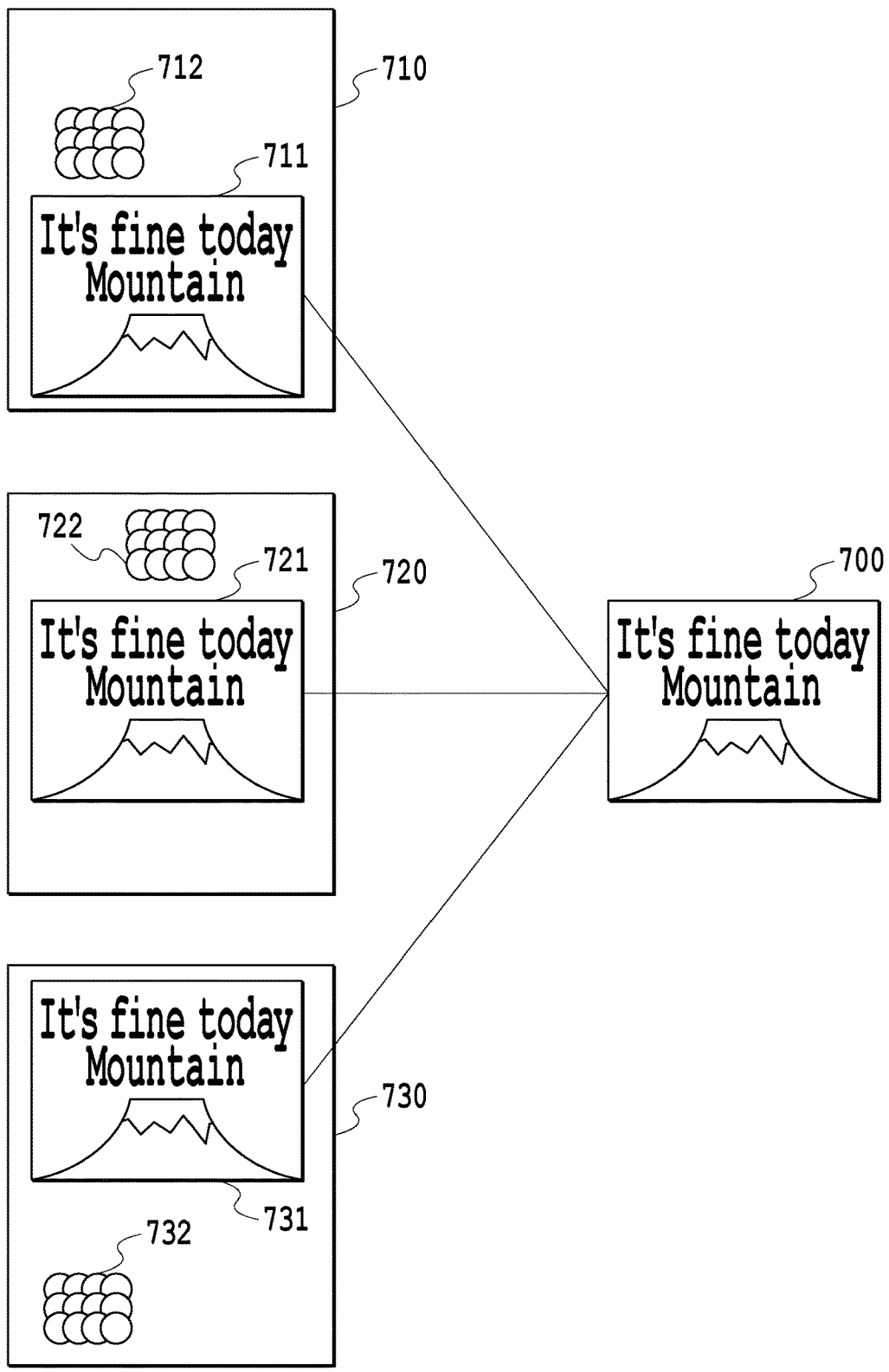
FIG. 7 is a diagram showing an example of a case where an image is shared.

The first embodiment is the aspect in which the image data of the entire page is created in the case where the number of image OBJs or the number of path OBJs within the page from which the annotation and text have been extracted is larger than or equal to the threshold value. However, in the case where the resource of an image OBJ is shared by a plurality of pages, there is a possibility that the file size increases on the contrary with the technique of the first embodiment. Here, an example is explained in which the resource of an image OBJ is shared. FIG. 7 is an example in which an image is shared in a document file including three pages in total, i.e., pages 710 to 730. Within the page 710, an image OBJ 711 is included, within the page 720, an image OBJ 721 is included, and within the page 730, an image OBJ 731 is included. Then, these three image OBJs 711, 721, and 731 share one image resource 700. Further, it is assumed that each of path OBJ groups 712, 722, and 723 included in each page is made up of 10,000 path OBJs and the data is held independently in each page. Here, in the case where the data size of the image resource 700 is supposed to be 100 MB and the data size of the three path OBJ groups is supposed to be 10 MB, the file size of the entire document is 110 MB. In the first embodiment, in the case where the number of image OBJs or the number of path OBJs is larger than or equal to the threshold value, the image data of each entire page is created, and here it is assumed that the data size of each page becomes 150 MB as the results of creating image data of each entire page because the image area becomes large. In this case, even though the data size of the image OBJ existing in each page becomes 50 MB by the compression processing, the file size of the entire document is 50 MB×3 (pages)=150 MB. This is larger than 110 MB, which is the original file size.

Consequently, an aspect is explained as a second embodiment in which even in the case where the number of image OBJs or the number of path OBJs within a page is larger than or equal to a threshold value, the image data of the entire page is not created on a condition that there exists an image OBJ shared by a plurality of pages. Explanation of the contents in common to those of the first embodiment is omitted or simplified and in the following, different points are explained mainly.

Figure 8:
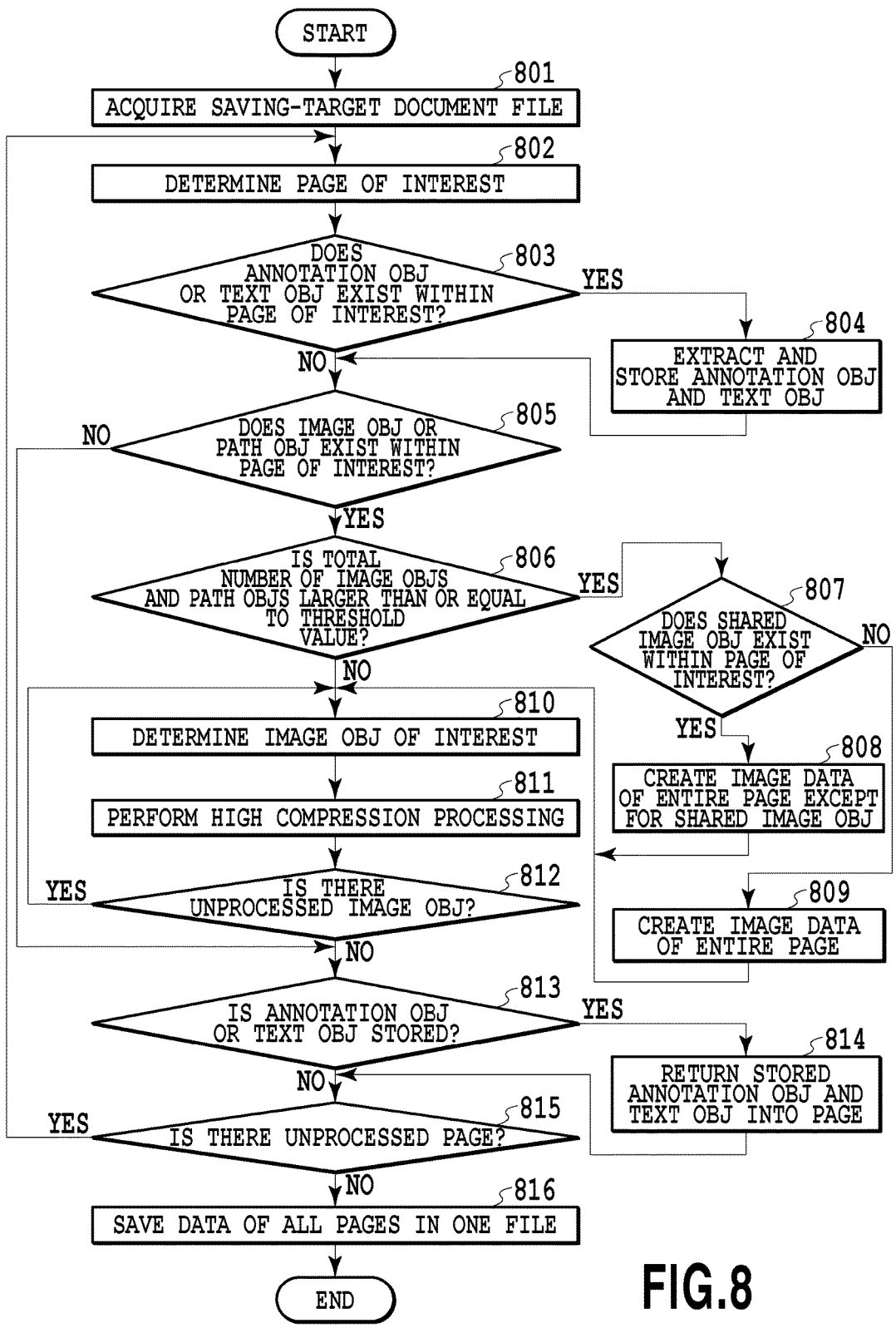
FIG. 8 is a flowchart showing a flow of document file saving processing according to a second embodiment.

FIG. 8 is a flowchart showing a flow of document file saving processing according to the present embodiment. Steps 801 to 806 correspond to steps 301 to 306 in the flow in FIG. 3 of the first embodiment. That is, in the case where there is an annotation OBJ or a text OBJ in the page of interest within the acquired saving-target document file, the OBJ is extracted from the page and stored (S801 to 804). Further, in the case where there is an image OBJ or a path OBJ within the page of interest, whether the total number of image OBJs and path OBJs is larger than or equal to a threshold value is determined (S805, 806). In the case where the results of the determination indicate that the number of image OBJs and path OBJs is larger than or equal to the threshold value, the processing advances to step 807. On the other hand, in the case where the number of image OBJs and path OBJs is less than the threshold value, the processing advances to step 810.

At step 807, whether an image OBJ whose resource is shared by a plurality of pages (hereinafter, shared image OBJ) exists within the page of interest is determined. In the case where a shared image OBJ exists, the processing advances to step 808. On the other hand, in the case where no shared image OBJ exists, the processing advances to step 809.

At step 808, the image data of the entire page except for the shared image OBJ is created. That is, the page from which the shared image OBJ, in addition to the annotation OBJ and the text OBJ, has been removed (page including only the other image OBJ and path OBJ) is the target of the processing to create image data of the entire page at this step. By the processing to create image data of the entire page, the entire page except for the shared image OBJ becomes one image OBJ. After the processing to create image data of the entire page, the processing advances to step 810 at which an image OBJ of interest is determined.

At step 809, as at step 307 in the flow in FIG. 3, the image data of the entire page from which the annotation OBJ and the text OBJ have been removed is created. After creating image data of the entire page, the processing advances to step 810 at which an image OBJ of interest is determined.

At step 810, an image OBJ of interest is determined from the image OBJs within the page of interest. Then, for the image OBJ of interest, the high compression processing described previously is performed (step 811, corresponding to step 309 in the flow in FIG. 3). The processing at each of the subsequent steps 812 to 816 corresponds to that at each of steps 310 to 314 in the flow in FIG. 3 and there is no difference therebetween in particular, and therefore, explanation is omitted.

By the processing such as above, for example, in the example in FIG. 7 described previously, the data size of the image resource is 50 MB and the data size of the three path OBJ groups is 10 MB, i.e., 60 MB in total, and therefore, it is possible to reduce the file size to a size smaller than 110 MB, which is the original file size.

According to the present embodiment, it is possible to obtain the same effect as that of the first embodiment even for a document file in which an image resource is shared by a plurality of pages.

Third Embodiment

Figure 9:
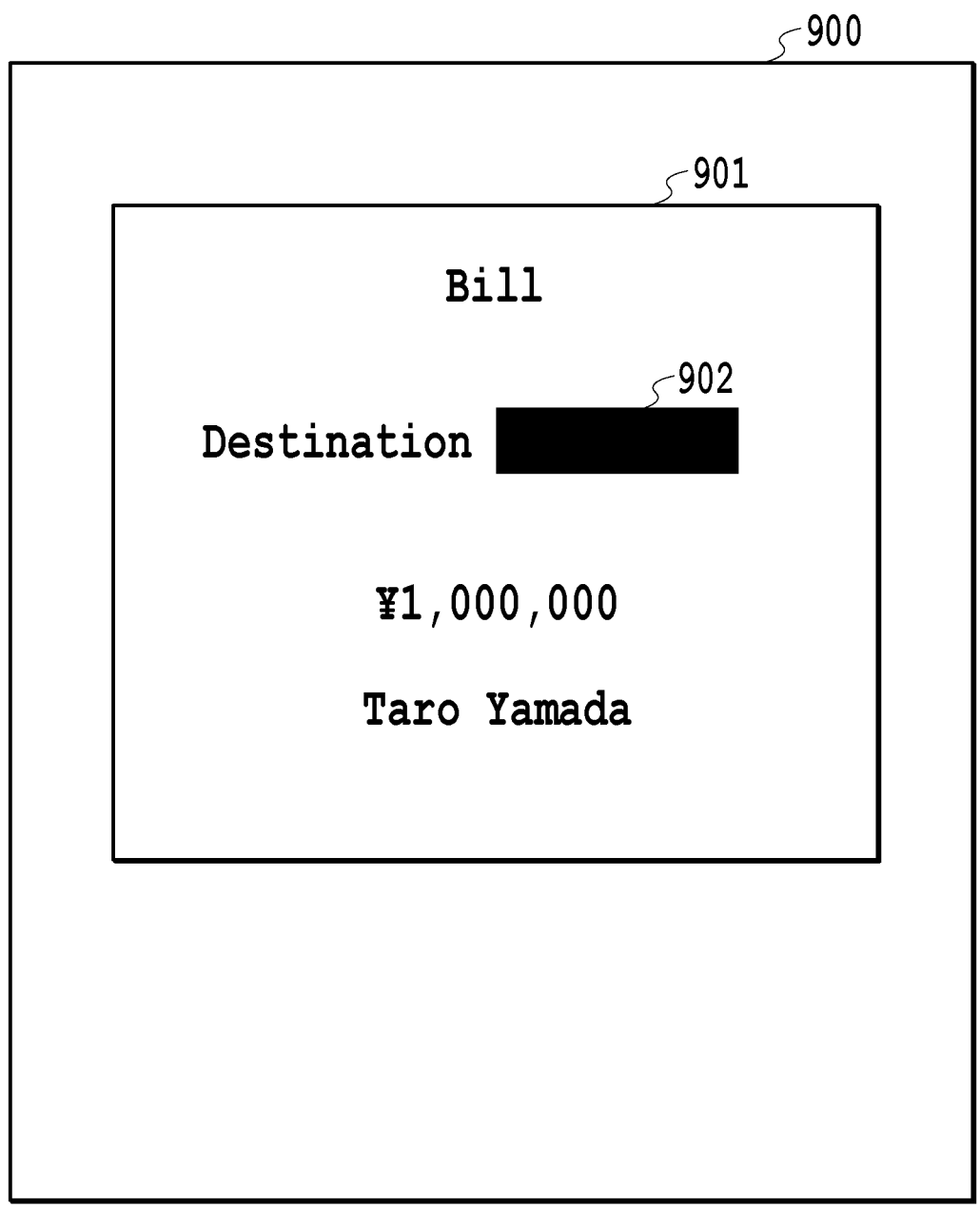
FIG. 9 is a diagram explaining a problem of a third embodiment.

In the first embodiment, the annotation OBJ and the text OBJ are deleted temporarily, but there is a case where this results in a problem from the viewpoint of information security, such as security protection. FIG. 9 shows a specific example of this. The example in FIG. 9 shows a case where a text OBJ 901 exists within a page 900 as a bill and the destination portion in the text OBJ 901 is prevented from being recognized visually by an opaque filling rectangular annotation OBJ 902. The application of the first embodiment to the case such as this will reveal the destination that should not originally be recognized visually in the processing on the way after the annotation OBJ is removed from the page. Finally, the annotation OBJ is returned to its original position, but in the case where, for example, this document format is the PDF, by software capable of editing the PDF, it is possible to easily move the annotation OBJ to visually recognize the destination. An aspect capable of dealing with such a problem is explained as a third embodiment. Explanation of the contents in common to those of the first embodiment is omitted or simplified and in the following, different points are explained mainly.

Figure 10:
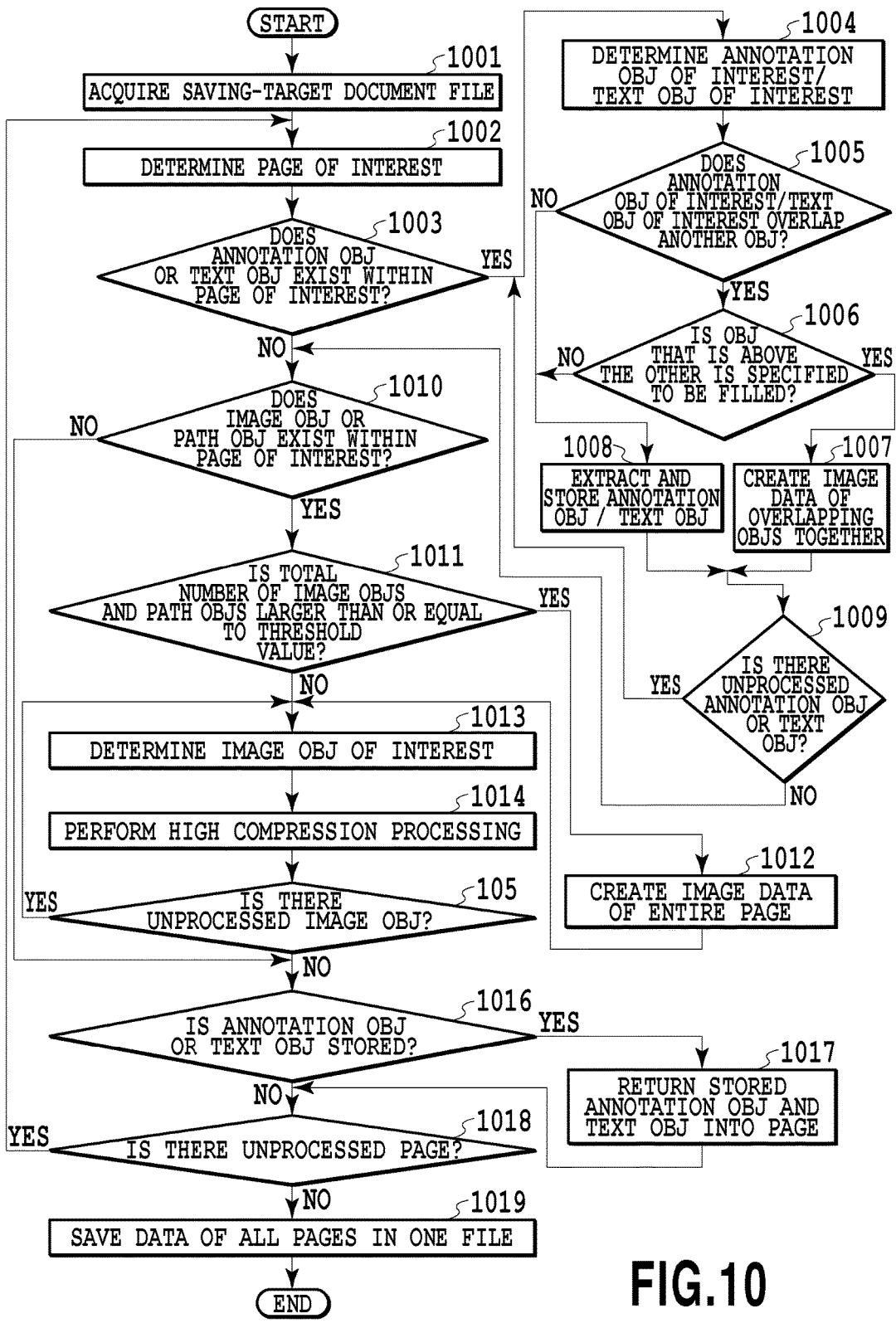
FIG. 10 is a flowchart showing a flow of document file saving processing according to the third embodiment.

FIG. 10 is a flowchart showing a flow of document file saving processing according to the present embodiment. Steps 1001 to 1003 correspond to steps 301 to 303 in the flow in FIG. 3 of the first embodiment. That is, in the case where a saving-target document file is acquired (S1001) and a page of interest is determined (S1002), whether there is an annotation OBJ or a text OBJ within the page of interest is determined (S1003). In the case where the results of the determination indicate that an annotation OBJ or a text OBJ exists within the page of interest, the processing advances to step 1004. On the other hand, in the case where neither annotation OBJ nor text OBJ exists within the page of interest, the processing advances to step 1010.

At step 1004, the object control unit 201 determines an annotation OBJ or a text OBJ on which attention is focused (hereinafter, annotation OBJ of interest or text OBJ of interest) within the page of interest.

At step 1005, the object control unit 201 determines whether the annotation OBJ of interest or the text OBJ of interest overlaps another OBJ. In the case where the annotation OBJ of interest or the text OBJ of interest overlaps another OBJ, the processing advances to step 1006. On the other hand, in the case where neither annotation OBJ of interest nor text OBJ of interest overlaps another OBJ, the processing advances to step 1008. In the example in FIG. 9, the annotation OBJ 902 and the text OBJ 901 overlap each other. Consequently, even in the case where one of them is the OBJ of interest, the processing advances to step 1006 as a result.

At step 1006, the object control unit 201 determines whether one of the OBJs overlapping each other, which is over the other OBJ (which is located on the upper layer side), is specified to be filled. For example, in the case where an opaque color is specified in the color information on the upper OBJ, it is determined that filling is specified. In the case where the results of the determination indicate that the upper OBJ is specified to be filled, the processing advances to step 1007. On the other hand, in the case where the upper OBJ is not specified to be filled, the processing advances to step 1008. In the example in FIG. 9, the annotation OBJ 902 is an annotation OBJ whose inside of the elongated rectangle is specified to be filled in opaque black, and therefore, the processing advances to step 1007 as a result.

At step 1007, the object control unit 201 creates image data of the objects overlapping each other together and generates one image OBJ. In the example in FIG. 9, one image OBJ that combines the text OBJ 901 and the annotation OBJ 902 together is generated. That is, the annotation OBJ 902 is turned into one image OBJ integrated with the text OBJ 901, and therefore, the annotation OBJ 902 is no longer an independent annotation OBJ. Due to this, it is possible to prevent the destination originally hidden by the annotation from being recognized visually in the subsequent processing and editing.

Step 1008 corresponds to step 304 in the flow in FIG. 3 and the annotation OBJ of interest or the text OBJ of interest is extracted from the page of interest and stored.

At step 1009, whether there is an unprocessed annotation OBJ or an unprocessed text OBJ within the page of interest is determined. In the case where the results of the determination indicate that there is an unprocessed annotation OBJ or an unprocessed text OBJ within the page of interest, the processing returns to step 1004 and the next annotation OBJ or text OBJ is determined and the processing is continued. On the other hand, in the case where all the annotation OBJs or all the text OBJs within the page of interest have already been processed, the processing advances to step 1010.

The processing at each of steps 1010-1019 corresponds to the processing at each of steps 305 to 314 and there is no difference therebetween in particular, and therefore, explanation is omitted.

In the example in FIG. 9 described previously, the data of the annotation OBJ 902 is not stored at step 1008, and therefore, the annotation OBJ 902 is not returned into the page at step 1017. That is, the page in the state where the destination within the text OBJ 901 is filled with the annotation OBJ 902 is saved at step 1019.

The above is the contents of the document saving processing according to the present embodiment.

According to the present embodiment, in the case where an object, such as an annotation, is used for the purpose of preventing confidential information within a page from being recognized visually, it is possible to obtain the same effect as that of the first embodiment while retaining the confidential information.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to the present invention, even in the case of a document file including an annotation and text within a page, it is possible to reduce the file size and to save the document file while retaining annotation or text information.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-106494 filed May 27, 2016, which is hereby incorporated by reference wherein in its entirety.

What is claimed is:

1. A compression method for compressing a document file in an image processing apparatus, the method comprising the steps of:
    extracting an annotation object and a text object from a page of the input document file, wherein the annotation object and the text object are not an image;
    determining that a number of a plurality of other objects is larger than or equal to a predetermined threshold value, wherein the plurality of other objects are objects included within the page except for the extracted annotation object and the extracted text object;
    converting the plurality of other objects into one image object in a case where it is determined that the number of the plurality of other objects is larger than or equal to the predetermined threshold value, wherein the plurality of other objects are objects included within the page except for the extracted annotation object and the extracted text object, and wherein the extracted annotation object and the extracted text object are not converted into the converted one image object;
    compressing the converted one image object in a case where it is determined that the number of the plurality of other objects is larger than or equal to the predetermined threshold value; and
    generating page data that include the extracted annotation object, the extracted text object and the compressed one image object in a case where it is determined that the number of the plurality of other objects is larger than or equal to the predetermined threshold value.

2. An image processing apparatus comprising:
    a memory; and
    one or more processors connected to the memory, the one or more processor being configured to:
    extract an annotation object and a text object from a page of an input document file, wherein the annotation object and the text object are not an image;
    determine whether a number of a plurality of other objects is larger than or equal to a predetermined threshold value, wherein the plurality of other objects are objects included within the page except for the extracted annotation object and the extracted text object;
    convert the plurality of other objects into one image object in a case where it is determined that the number of the plurality of other objects is larger than or equal to the predetermined threshold value, wherein the extracted annotation object and the extracted text object are not converted into the converted one image object;
    compress the converted one image object in a case where it is determined that the number of the plurality of other objects is larger than or equal to the predetermined threshold value; and
    generate page data by returning the extracted annotation object, the extracted text object into the compressed one image object in a case where it is determined that the number of the plurality of other objects is larger than or equal to the predetermined threshold value.

3. The image processing apparatus according to claim 1, wherein
    the plurality of other objects are image objects and path objects.

4. The image processing apparatus according to claim 3, wherein,
    in a case where it is determined that the total number of the image objects and the path objects included within the page is larger than or equal to the predetermined threshold value, the one or more processors convert the image object and the path object included within the page into the one image object and compress the converted one image object.

5. The image processing apparatus according to claim 3, wherein
    as the predetermined threshold value, a first threshold value to be compared with a number of the image objects and a second threshold value to be compared with a number of the path objects are set separately, and,
    at least in one of a case where the one or more processors determine that the number of the image objects is larger than or equal to the first threshold value and a case where the one or more processors determine that the number of the path objects is larger than or equal to the second threshold value, the one or more processors convert the image object and the path object included within the page into the one image object and compress the converted one image object.

6. The image processing apparatus according to claim 1, wherein
the converted one image object is divided into a text area and a background area and different scheme compression processing is applied to the text area and the background area, respectively.

7. The image processing apparatus according to claim 6, wherein
reversible compression processing is applied to a character image included in the text area and irreversible compression processing is applied to a background image included in the background area.

8. The image processing apparatus according to claim 1, wherein, in a case where the one or more processors determine that a resource of an image object is shared by a plurality of pages included in the input document file, the one or more processors convert the other objects and the resource of the image object shared by the plurality of pages into one image object and compress the converted one image.

9. The image processing apparatus according to claim 1, wherein, in a case where the one or more processors determine that an object specified to be filled with an opaque color overlaps the annotation object or the text object in a page of the input document file, the one or more processors convert the annotation object and the overlapping object or the text object and the overlapping object into one image object, and extract the annotation object or the text object that is not overlapped by the object specified to be filled with an opaque color is extracted.

10. A non-transitory computer readable storage medium storing a program for causing a computer to:
extract an annotation object and a text object from a page of an input document file, wherein the annotation object and the text object are not an image;
determine whether a number of a plurality of other objects is larger than or equal to a predetermined threshold value, wherein the plurality of other objects are objects included within the page except for the extracted annotation object and the extracted text object;
convert the plurality of other objects into one image object in a case where it is determined that the number of the plurality of other objects is larger than or equal to the predetermined threshold value, wherein the plurality of other objects are objects included within the page except for the extracted annotation object and the extracted text object, and wherein the extracted annotation object and the extracted text object are not converted into the converted one image object;
compress the converted one image object in a case where it is determined that the number of the plurality of other objects is larger than or equal to the predetermined threshold value; and
generate page data that include the extracted annotation object, the extracted text object and the compressed one image object in a case where it is determined that the number of the plurality of other objects is larger than or equal to the predetermined threshold value.

11. The storage medium according to claim 10, wherein the other objects included within the page except for the extracted annotation object and text object are an image object and a path object.

12. The storage medium according to claim 10, wherein the converted one image object is divided into a text area and a background area and different scheme compression processing is applied to the text area and the background area, respectively.

13. An image processing apparatus comprising:
a memory; and
one or more processors connected to the memory, the one or more processor being configured to:
extract an annotation object and a text object from a page of an input document file, wherein the annotation object and the text object are not an image;
determine whether a number of a plurality of other objects is larger than or equal to a predetermined threshold value, wherein the plurality of other objects are objects included within the page except for the extracted annotation object and the extracted text object, and wherein the plurality of other objects include image objects and path objects;
convert the other objects into one image object in a case where it is determined that the number of the plurality of other objects is larger than or equal to the predetermined threshold value, wherein the extracted annotation object and the extracted text object are not converted into the converted one image object;
compress the converted one image object in a case where it is determined that the number of the plurality of other objects is larger than or equal to the predetermined threshold value;
compress each of the image objects included in the other objects in a case where it is determined that the number of the plurality of other objects is smaller than the predetermined threshold value;
generate page data by returning the extracted annotation object, the extracted text object into the compressed one image object in a case where it is determined that the number of the plurality of other objects is larger than or equal to the predetermined threshold value; and
generate page data that include the extracted annotation object, the extracted text object, each of the compressed image objects and the path objects in a case where it is determined that the number of the plurality of other objects is smaller than the predetermined threshold value.

14. A non-transitory computer readable storage medium storing a program for causing a computer to:
extract an annotation object and a text object from a page of an input document file, wherein the annotation object and the text object are not an image;
determine whether a number of a plurality of other objects is larger than or equal to a predetermined threshold value, wherein the plurality of other objects are objects included within the page except for the extracted annotation object and the extracted text object, and wherein the other objects include image objects and path objects;
convert the plurality of other objects into one image object in a case where it is determined that the number of the plurality of other objects is larger than or equal to the predetermined threshold value, wherein the extracted annotation object and the extracted text object are not converted into the converted one image object;
compress the converted one image object in a case where it is determined that the number of the plurality of other objects is larger than or equal to the predetermined threshold value;
compress each of the image objects included in the other objects in a case where it is determined that the number of the plurality of other objects is smaller than the predetermined threshold value;
generate page data that include the extracted annotation object, the extracted text object and the compressed one image object in a case where it is determined that the number of the plurality of other objects is larger than or equal to the predetermined threshold value; and generate page data that include the extracted annotation object, the extracted text object, each of the compressed image objects and the path objects in a case where it is determined that the number of the plurality of other objects is smaller than the predetermined threshold value.

* * * * *